United States Patent [19]

Jackson

[11] Patent Number: 5,565,381
[45] Date of Patent: Oct. 15, 1996

[54] METHOD OF REMOVING SHARP EDGES IN A DIELECTRIC COATING LOCATED ABOVE A SEMICONDUCTOR SUBSTRATE AND A SEMICONDUCTOR DEVICE FORMED BY THIS METHOD

[75] Inventor: Daniel J. Jackson, Chandler, Ariz.

[73] Assignee: Microchip Technology Incorporated, Chandler, Ariz.

[21] Appl. No.: 283,603

[22] Filed: Aug. 1, 1994

[51] Int. Cl.⁶ .................................................. H01L 21/44
[52] U.S. Cl. ........................ 437/195; 437/228; 437/246
[58] Field of Search .................................. 437/195, 228, 437/246, 243

[56] References Cited

U.S. PATENT DOCUMENTS

| | | |
|---|---|---|
| 4,948,743 | 8/1990 | Ozaki . |
| 5,104,482 | 4/1992 | Monkowski et al. . |
| 5,164,340 | 11/1992 | Chen et al. . |
| 5,179,042 | 1/1993 | Mikoshiba et al. ................. 437/187 |
| 5,229,325 | 7/1993 | Park et al. ........................... 437/187 |
| 5,269,880 | 12/1993 | Jolley et al. . |
| 5,369,302 | 11/1994 | Chen et al. . |

FOREIGN PATENT DOCUMENTS

| | | |
|---|---|---|
| 1283820 | 11/1989 | Japan . |
| 6112151 | 4/1994 | Japan . |

*Primary Examiner*—George Fourson
*Assistant Examiner*—C. Everhart
*Attorney, Agent, or Firm*—Harry M. Weiss; Jeffrey D. Moy; Harry M. Weiss & Associates, P.C.

[57] ABSTRACT

This disclosure is directed to a method of producing a smooth surface for a dielectric coating that is located above the surface of a semiconductor substrate containing doped regions of a semiconductor device. Sharp edges formed in the dielectric coating during certain semiconductor processing steps are removed using a deposition process to deposit a separate insulating layer on the dielectric coating containing the sharp edges followed by an annealing operation and the subsequent removal of the separate insulating layer to permit the subsequent formation of electrodes on a smooth surface of the dielectric coating.

5 Claims, 2 Drawing Sheets

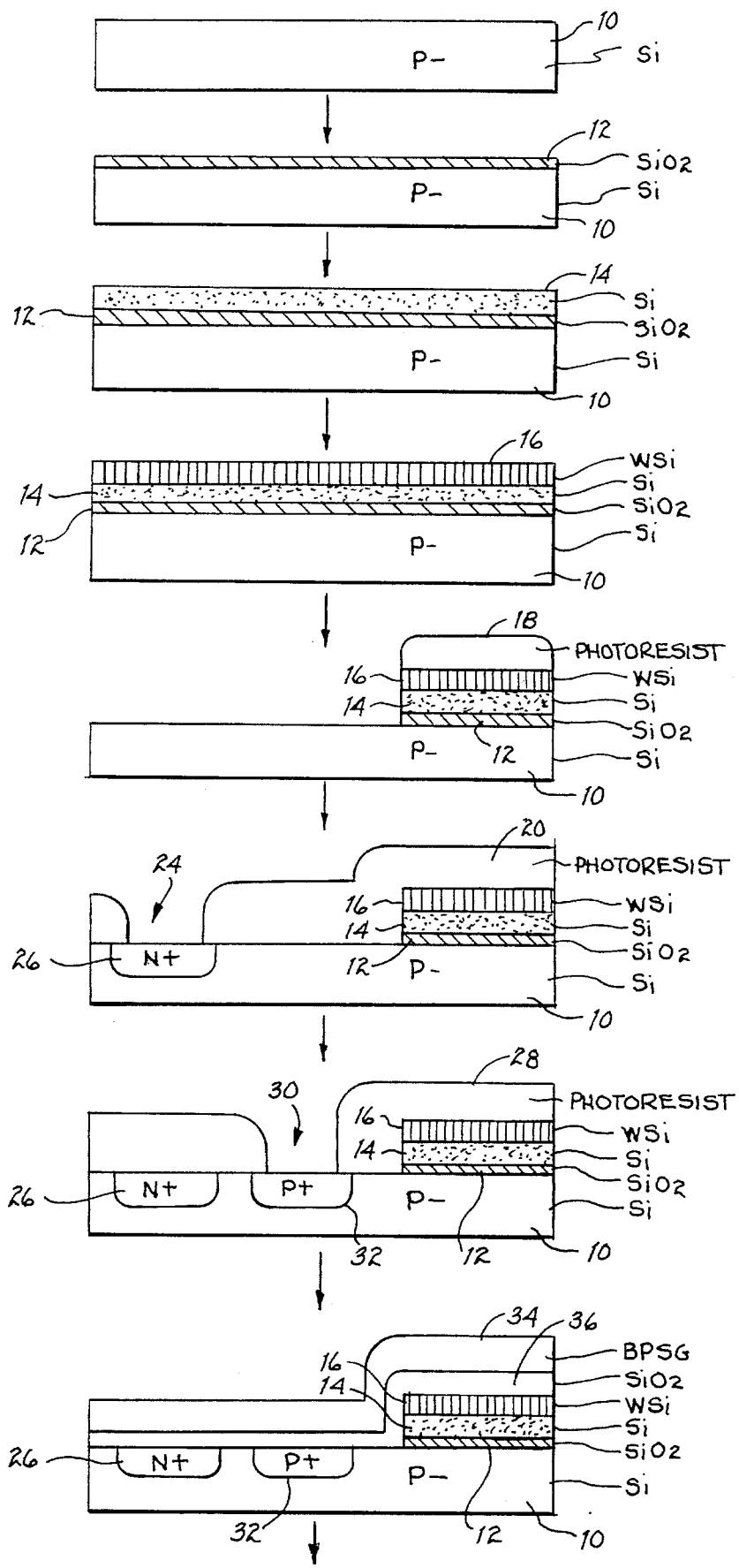

5,565,381

METHOD OF REMOVING SHARP EDGES IN A DIELECTRIC COATING LOCATED ABOVE A SEMICONDUCTOR SUBSTRATE AND A SEMICONDUCTOR DEVICE FORMED BY THIS METHOD

FIELD OF THE INVENTION

This invention relates to methods for fabricating semiconductor devices and products produced by these methods and, more particularly, this invention relates to semiconductor methods for removing sharp edges on a surface of a dielectric coating located above a semiconductor substrate and semiconductor devices formed by these methods. Another purpose of this invention is to remove sharp edges and electrically activate a implant region while protecting contact regions from dopant poisoning or dopant segregation.

BACKGROUND OF THE PRIOR ART

In the past, many various different types of methods were developed for fabricating semiconductor devices wherein openings were formed in one or more dielectric layers or coatings deposited on or above a surface of these semiconductor devices in order to permit the subsequent formation of metal contacts to be made to different P or N doped regions of these semiconductor devices. The formation of metal contacts to the various semiconductor regions of semiconductor devices was generally considered to be a fairly standard process wherein photolithographic masking and etching techniques were used to open up holes in one or more dielectric layers or coatings on or above the surface of the semiconductor devices in order to permit the subsequent formation of metal contacts to the underlying exposed semiconductor regions of these semiconductor devices. These metal contacts to the various semiconductor regions of the semiconductor devices had to be extremely reliable because any failure in the formation and performance or operation of any one of the metal contacts would usually result in the destruction or failure of the semiconductor device associated therewith. Usually, these metal contacts to the various semiconductor regions of the semiconductor devices were electrically connected to conductive stripes or conductive lands running along a surface of a dielectric layer or coating located on or above the surface of the underlying semiconductor regions of the associated semiconductor device.

Thus, one great fear in the fabrication of semiconductor devices is the concern that a cracked metal conductor land, metal stripe or associated metal contact will be created thereby forming an electrical "open" condition which resulted in the destruction of the entire semiconductor device.

Accordingly, it became very critical to insure that the semiconductor process or method steps or operations to fabricate the semiconductor devices would not produce a situation where conductive metal lands, stripes, or the metal contacts connected to the metal conductor stripes or lands would not be subjected to cracking or exposure to cracking. For example, semiconductor process engineers have focused on avoiding situations where these metal electrodes or contacts or their associated electrically conductive lands or stripes would have a likelihood or tendency to crack during the process of forming these contacts or electrodes or their associated electrically conductive lands or stripes.

In the fabrication of many types of semiconductor devices, the metal contacts or electrodes or electrically conductive stripes or lands connected or associated therewith or coupled thereto were generally deposited in contact with a portion of the top surface of an underlying dielectric or insulating coating or layer. Consequently, if the underlying dielectric or insulating layer had sharp edges, then the deposited and formed metal contacts or electrodes and the electrically conductive lands or stripes would have to be deposited on and over these sharp edges of the dielectric or insulating layer which was not good from a semiconductor processing viewpoint due to the greater likelihood or increased probability that there would be cracking (formation of an "open") at the junction of the sharp edges of the insulating layer.

Accordingly, there was a need to provide a process or method for smoothing out sharp edges on a dielectric or insulating layer to be located beneath a deposited metal layer that would be used to form metal electrodes and/or electrically conductive lands or stripes for providing electrical connection to various regions of the semiconductor device.

SUMMARY OF THE INVENTION

It is an object of this invention to provide an improved method for producing a smooth surface on a dielectric coating prior to the deposition of a metal layer thereon for use in the subsequent formation or creation of an electrically conductive land, stripe, or associated metal contacts or electrodes.

It is another object of this invention to provide an improved method for smoothing out sharp edges initially located on a surface of a dielectric coating prior to depositing a metal layer thereon which method is compatible with semiconductor processing techniques.

BRIEF DESCRIPTION OF THE PREFERRED EMBODIMENT

In accordance with one embodiment of this invention, a method is disclosed for producing a smooth surface for a dielectric coating prior to depositing and forming metal contacts on the dielectric coating and in contact with certain exposed regions of a semiconductor substrate located beneath the dielectric coating which comprises the steps of: removing portions of the dielectric coating thereby forming sharp edges on surface portions thereof in the process of providing openings therein to expose the regions of the semiconductor substrate to permit the subsequent formation of the metal contacts to the regions; and depositing a separate, different dielectric layer on the dielectric coating and heat treating at a temperature and for a period of time sufficient to smooth out the sharp edges on the surface portions thereof to permit subsequent formation of more reliable metal contacts to the regions because portions of these metal contacts are to be located on smoothed out portions of the dielectric coating.

The foregoing and other objects, features and advantages of this invention will be apparent from the following more particular description of the preferred embodiment of the invention as illustrated in the accompanying drawings.

BRIEF DESCRIPTION OF THE FIGURES

FIG. 1 depicts a side elevation view of a portion of a semiconductor wafer which is used as a starting semiconductor substrate of P- type conductivity.

FIG. 2 is a side elevational view similar to FIG. 1 showing the deposition of a silicon dioxide insulating layer on a surface of a P- substrate.

FIG. 3 is a view similar to FIG. 2 showing the deposition and formation of a doped silicon electrically conductive layer on the silicon dioxide insulating layer located on the P- substrate.

FIG. 4 is a view similar to FIG. 3 showing the deposition of a tungsten silicon low resistance electrically conductive layer on the doped silicon electrically conductive layer that is located on the silicon dioxide insulating layer that is on the top surface of the P- substrate.

FIG. 5 is a view similar to FIG. 4 showing the deposition of a photoresist mark type layer followed by a photolithographic masking and etching step to provide the elevated multi-layer structure shown locate don a surface portion of the top surface of the P- substrate.

FIG. 6 is a view similar to FIG. 5 after the deposition of another photoresist mark type layer followed by a photolithographic masking and etching operation to form an opening in the photoresist mask type layer therein to permit use of an N+ diffusion or ion implantation process operation to form an N+ region in the P- substrate.

FIG. 7 is a view similar to FIG. 6 showing the formation of still another photoresist mask type layer followed by a photolithographic masking and etching operation to create an opening in this photoresist mask type layer to permit the subsequent ion implantation or diffusion of a P+ region in the P- substrate.

FIG. 8 is a view similar to FIG. 7 showing the deposition of both a silicon dioxide insulating layer and an overlying boron phosphosilicate insulating glass layer on the structure of FIG. 7 after the photoresist mask type layer used in FIG. 7 has been removed.

DESCRIPTION OF THE PREFERRED EMBODIMENT

Figure 9:
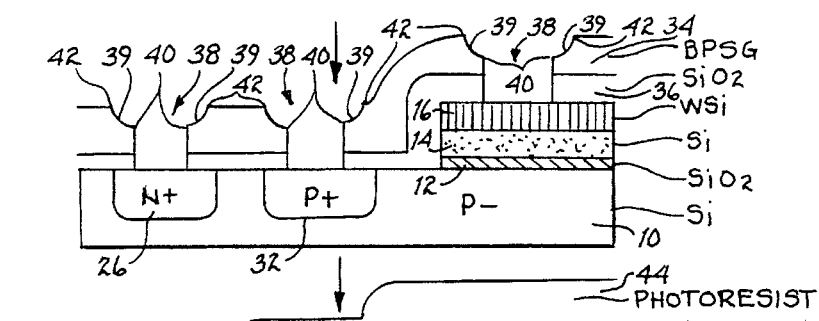
FIG. 9 is a view similar to FIG. 8 following a photolithographic masking and etching operation to form openings in the boron phosphosilicate glass layer and in the underlying silicon dioxide layer to expose a surface portion of the tungsten silicon layer or coating and the P+ and N+ regions located in the P- semiconductor substrate.

Referring to FIG. 1, a portion of a P- type semiconductor substrate 10 is shown which is preferably formed from a wafer of P- type conductivity that is cut from a crystal of P- type conductivity that is grown using conventional crystallographic growth techniques. For example, the P- type crystal that is used contains a P type dopant such as Boron.

Referring to FIG. 2, a silicon dioxide insulating layer 12 is located on the semiconductor underlying substrate 10 and is preferably formed using either thermal oxide growth techniques or using a deposition process such as a chemical vapor deposition (CVD) process.

Referring to FIG. 3, an electrically conductive doped polycrystalline silicon layer 14 is deposited or formed on the top surface of the insulating silicon dioxide layer 12 on the opposite side thereof from the P- substrate 10. The deposition of the silicon layer 14 can be carried out using, for example, a CVD process or any suitable deposition technique such as sputtering, etc. Preferably, the doped polysilicon layer 14 is doped with an N type impurity such as Phosphorous.

Referring to FIG. 4, a low resistance electrically conductive tungsten silicon layer 16 is deposited on the top surface of the doped polysilicon layer 14. The advantage of the low resistance, electrically conductive tungsten silicon layer 16 is that it reduces the overall electrical resistance of the electrical conductor provided by the combination of the doped polysilicon layer 14 that is in contact with the low resistance electrically conductive tungsten silicon layer 16. The tungsten silicon layer 16 can be deposited using, for example, an evaporation process or a sputtering process, as desired.

Referring to FIG. 5, a photoresist mask type layer 18 is deposited on the surface of the tungsten silicon layer 16 and, following a photolithographic masking and etching operation, a relatively large opening is formed in the photoresist layer 18 which permits the subsequent etching away of a portion of the tungsten silicon layer 16, the underlying doped polysilicon layer 14 and the silicon dioxide insulating layer 12 to expose a relatively large surface portion of the P- substrate 10 as shown on the top left side portion of FIG. 5. As a result, the elevated structure on the right top side portion of FIG. 5 is left remaining showing the portion of the photoresist mask type layer 18 that has not been etched away and the underlying low resistance tungsten silicon layer 16 and the conductive doped polysilicon layer 14 that is between the tungsten silicon layer 16 and the underlying silicon dioxide insulating layer 12 which is located on the P- substrate 10.

Referring to FIG. 6, this figure shows a structure similar to FIG. 5 following the deposition of another photoresist layer 20. Also, FIG. 6 shows the resulting structure following a photolithographic masking operation to form opening 24 in the photoresist layer 20 to permit the formation, by ion implantation or diffusion of an N+ (i.e. phosphorous doped) semiconductor region 26 in the P- substrate 10.

Referring to FIG. 7, the structure of FIG. 6 is shown in FIG. 7 with the addition of a new photoresist mask type layer 28 that is deposited over the tungsten silicon layer 16 and the exposed top surface of the N+ doped region 26 and the remaining exposed P- silicon substrate 10. In the structure shown in FIG. 7, an opening 30 is formed in the photoresist layer 28 using conventional photolithographic masking techniques to expose a portion of the semiconductor substrate 10 to permit the formation therein by, for example, ion implantation or diffusion techniques of a P+ region 32. The P type dopant used to form the P+ region 32 can be boron or any other suitable P type dopant.

Referring to FIG. 8, a layer of boron phosphosilicate glass 34 is shown deposited on the entire top surface of the semiconductor structure depicted in FIG. 7 after the removal of the photoresist layer 28 shown in FIG. 7 following the prior deposition of an underlying silicon dioxide insulating layer 36 such as by CVD techniques.

Referring to FIG. 9, a plurality of openings 38 are shown in the boron phosphosilicate glass layer 34 and the underlying silicon dioxide insulating layer 36 to permit subsequent electrical contacts to be made to the N+ region 26, the P+ region 32 and a portion of the tungsten silicon layer 16. Associated with each of the three openings shown in FIG. 9 are curved portions 39 which are created during the photolithographic masking and etching operation to form the openings 38 in the top boron phosphosilicate glass layer 34. These curved surface portions 39 have associated with them a pair of relatively sharp edge portions 40 and 42, respectively, being the bottom and top sharp edge portions shown in the embodiment of FIG. 9. These sharp edge portions 40 and 42 associated with each of the curved surface portions 39 in the boron phosphosilicon glass layer 34 are serious problems because electrically conductive metal material that may subsequently be deposited over these sharp edges 40 and 42 can result in the subsequent cracking of the metal material at the sharp edge thereby creating an "open" condition and the subsequent failure of the semiconductor device associated with the semiconductor structure shown in FIG. 9.

Figure 10:
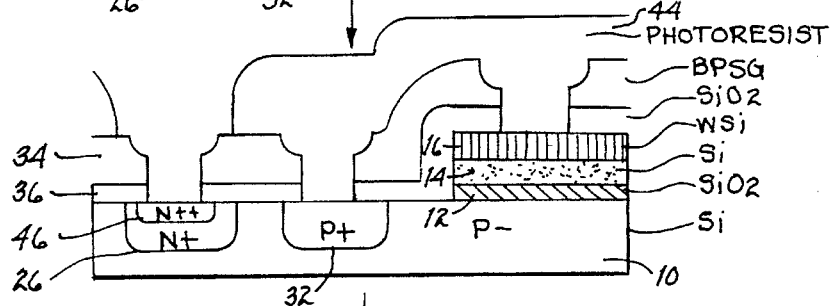
FIG. 10 is a view similar to FIG. 9 following the deposition of still another photoresist mask type layer and followed by a photolithographic masking, etching, and ion implant operation to permit the formation of an N++ region in the N+ region located in the P- substrate.

Referring to FIG. 10, this figure depicts the structure of FIG. 9 following the deposition of a still another photoresist mask type layer 44 and a subsequent photolithographic masking operation to create an opening in the photoresist layer 44 (as shown on the left side portion of the structure of FIG. 10) to permit, by implantation or diffusion an N++ region 46 to be formed in the N+ region 26 located in the P- substrate 10. Again, phosphorus, arsenic or any suitable N type dopant can be used in the formation of the highly doped N++ region 46.

Figure 11:
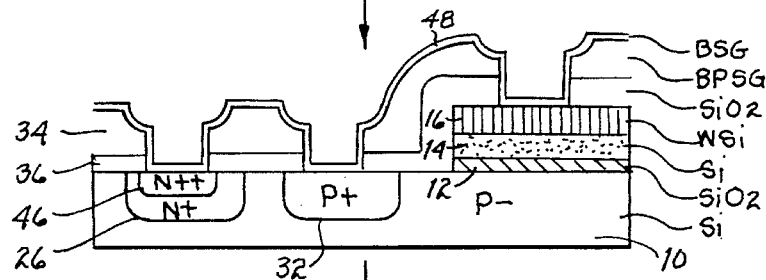
FIG. 11 is a view similar to FIG. 10 following the removal of the photoresist masking type layer and the deposition of a thin borosilicate glass layer on both the boron phosphosilicate glass layer and on the exposed surface portions of the N++ and P+ regions.

Referring to FIG. 11, a thin (i.e. 500 Angstroms) borosilicate glass layer 48 is now deposited over the entire structure depicted in FIG. 10 after the removal of the photoresist layer 44 that was deposited in FIG. 10. This thin borosilicate glass layer 48 is deposited preferably at a temperature of about 430 degrees centigrade using a CVD process.

Figure 12:
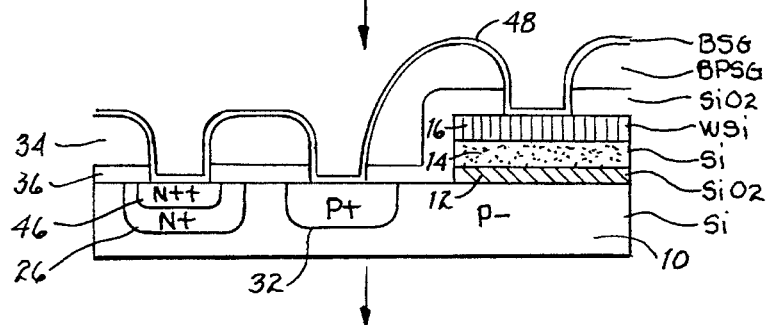
FIG. 12 is a view similar to FIG. 11 following a heat treatment or annealing operation to smooth out the sharp edges located in both the borosilicate glass layer and the underlying boron phosphosilicate glass layer shown in FIG. 11 which also electrically activates the ion implanted N++ region of the device.

Referring to FIG. 12, subsequent to the deposition of this borosilicate glass layer 48 a heat treatment or annealing operation is carried out at a temperature of about 950 degrees centigrade for a period of about 30 minutes which is a period of time sufficient to smooth over the sharp edges 40 and 42 and to electrically activate the ion implanted N++ region 46. FIG. 12 depicts the structure of FIG. 11 following this heat treatment or anneal process. One important feature of this heat treatment or anneal process is that the borosilicate layer 48 serves as a barrier type layer to prevent out diffusion of ion impurities from either the boron phosphosilicate glass layer 34 and the exposed regions of the semiconductor substrate 10 including the backside of the substrate 10. Also, the borosilicate layer 48 prevents undesired out diffusion of P type impurities from the P+ region 32. As can be seen with reference to FIG. 12, both the borosilicate glass layer 48 and the underlying boron phosphosilicate glass layer 34 have smoothed out surface portions that have eliminated the sharp edges 40 and 42 shown in FIGS. 9 and 10.

Figure 13:
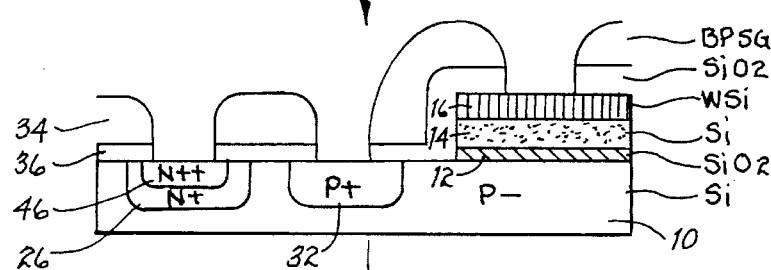
FIG. 13 is a view similar to FIG. 12 after removal of the borosilicate glass layer thereby exposing the rounded or smoothed out boron phosphosilicate glass layer.

Referring to FIG. 13, this figure depicts the structure of FIG. 12 following the removal by an etchent to etch away the borosilicate glass layer 48 thereby leaving exposed a surface portion of the N++ region 46, the P+ region 32, and the tungsten silicon layer 16. Now the structure of FIG. 13 is ready for the deposition of a metal layer that can be used to provide electrical contact to the low resistance tungsten silicon layer 16 and ohmic contacts to both the P+ region 32 and the N++ region 46.

Figure 14:
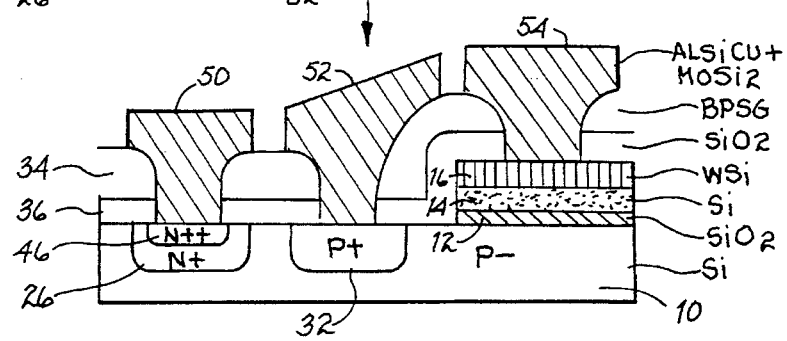
FIG. 14 is a view similar to FIG. 13 after a metal layer has been deposited and followed by a photolithographic masking and etching operation to provide the separate metal electrode contacts as shown.

Referring to FIG. 14, three separate metal electrodes 50, 52, and 54 are formed using photolithographic masking and etching techniques to separate these electrodes (after the prior deposition of preferably an initial ohmic contact layer, Molybdenum Disilicide, followed by the deposition of an Aluminum Silicon Copper layer). Accordingly, the structure of FIG. 14 is now complete and the N++ region 46 and the P+ region 32 can be electrically connected, as desired, to provide a semiconductor device by using the electrodes or contacts 50 and 52, respectively. The electrode 54 serves to contact the low resistance tungsten silicon layer 16 which is in electrical contact to the doped polysilicon layer 14 to thereby permit electrical contact to the conductive land comprising the tungsten silicon layer 16 and the doped polysilicon layer 14.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A method of producing a smooth surface for a dielectric coating prior to depositing and forming metal contacts on the dielectric coating and in contact with certain exposed regions of a semiconductor substrate located beneath the dielectric coating comprising the steps of:

removing portions of said dielectric coating comprising a top layer of boron phosphosilicate glass and an underlying layer of silicon dioxide thereby forming sharp edges on surface portions thereof in the process of providing openings therein to expose the regions of said semiconductor substrate to permit the subsequent formation of the metal contacts to said regions;

depositing a separate, different borosilicate glass dielectric layer on said dielectric coating and heat treating at a temperature and for a period of time sufficient to both smooth out said sharp edges on said surface portions thereof to permit subsequent formation of more reliable metal contacts to said regions because portions of these metal contacts are to be located on smoothed out portions of said dielectric coating and to protect said exposed regions of said semiconductor substrate from dopant poisoning and dopant segregation; and completely removing said separate different dielectric layer prior to the subsequent formation of said more reliable metal contacts.

2. The method of claim 1 including the step of depositing a primarily metal layer on said dielectric coating and in electrical contact with said regions of said semiconductor substrate after removing said separate, different dielectric layer.

3. The method of claim 2 including the step of removing portions of said primarily metal layer for forming separate metal contacts to said regions of said semiconductor substrate.

4. The method of claim 2 including the step of removing portions of said primarily metal layer for forming separate metal contacts to said regions of said semiconductor substrate, said separate metal contacts comprising Aluminum Silicon Copper.

5. The method of claim 4 wherein said separate metal contacts also comprising Molybdenum Silicon.

\* \* \* \* \*